(12) United States Patent
Wang et al.

(10) Patent No.: US 7,652,533 B2
(45) Date of Patent: Jan. 26, 2010

(54) OPERATION AMPLIFIER FOR IMPROVING SLEW RATE

(75) Inventors: Ling-Yun Wang, Tainan County (TW); Yaw-Guang Chang, Tainan County (TW)

(73) Assignee: Himax Technologies Limited, Tainan County (TW)

(*) Notice: Subject to any disclaimer, the term of this patent is extended or adjusted under 35 U.S.C. 154(b) by 4 days.

(21) Appl. No.: 12/033,269

(22) Filed: Feb. 19, 2008

(65) Prior Publication Data

US 2009/0206929 A1    Aug. 20, 2009

(51) Int. Cl.
*H03F 3/45* (2006.01)
(52) U.S. Cl. .................................................. 330/253
(58) Field of Classification Search .............. 330/253, 330/147, 148, 255
See application file for complete search history.

(56) References Cited

U.S. PATENT DOCUMENTS 5,825,250 A * 10/1998 Tomasini et al. ............ 330/292

6,392,485 B1 * 5/2002 Doi et al. ..................... 330/253

FOREIGN PATENT DOCUMENTS

JP          06291576 A     * 10/1994

* cited by examiner

*Primary Examiner*—Robert Pascal
*Assistant Examiner*—Khiem D Nguyen
(74) *Attorney, Agent, or Firm*—J.C. Patents

(57) ABSTRACT

An OP amplifier including an input stage and an output stage for improving a slew rate is provided. The input stage receives one of input voltages, and generates an internal voltage according to the received input voltage. The output stage receives and gains the internal voltage, and outputs an output voltage. The output stage includes a first transistor, a plurality of first capacitors and a first switching unit. The first transistor includes a first source/drain terminal coupled to a first voltage, a gate terminal controlled by the internal voltage. The output stage outputs the output voltage according to a voltage at a second source/drain terminal of the first transistor. First terminals of the first capacitors are coupled to the second source/drain terminal of the first transistor. The first switching unit selectively transmits the internal voltage to the second terminal of a corresponding one of the first capacitors.

12 Claims, 7 Drawing Sheets

US 7,652,533 B2

OPERATION AMPLIFIER FOR IMPROVING SLEW RATE

BACKGROUND OF THE INVENTION

1. Field of the Invention

The present invention generally relates to an operation amplifier, and more particularly, to an operation amplifier for improving a slew rate.

2. Description of Related Art

FIG. 1A illustrates a conventional source driver. The source driver includes a Gamma generator 110, an interface circuit 120 and a Digital-to-Analog Converter (DAC) 130 for receiving a digital data Din to drive a panel (not shown). The Gamma generator 110 provides a plurality of Gamma reference voltages to the DAC 130. The DAC 130 selects one of the Gamma reference voltages respectively in accordance with the digital data outputted from the interface circuit 120. The DAC 130 outputs the selected Gamma reference voltage(s) for driving the panel (not shown). In one embodiment, the Gamma generator 110 generates three sets of Gamma reference voltages, and the three sets respectively correspond to R, G and B data. The first set of the Gamma reference voltages includes red Gamma reference voltages Gr0, Gr1, Grn; the second set of Gamma reference voltages includes green Gamma reference voltages Gg0, Gg1, ..., Ggn; the third set of Gamma reference voltages includes blue Gamma reference voltages Gb0, Gb1, ..., Gbn.

FIG. 1B illustrates the output stage of the Gamma generator 110 in the source driver of FIG. 1A. The output stage of the Gamma generator 110 includes OP amplifiers OPA0, OPA1, ..., OPAn. Each OP amplifier is used as a buffer that sequentially receives the corresponding red, green and blue Gamma reference voltages for outputting to the DAC 130. Specifically, the buffer OPA0 receives the Gamma reference voltages (Gr0, Gg0, Gb0); the buffer OPA1 receives the Gamma reference voltages (Gr1, Gg1, Gb1); the buffer OPAn receives the Gamma reference voltages (Grn, Ggn, Gbn).

FIG. 1C illustrates a circuit of a conventional OP amplifier. The OP amplifier OPAn includes an input stage 111 and an output stage 112. The input stage 111 may respectively receive input voltages Vin1 through Vinm of different magnitudes, and the output stage 112 correspondingly generates different output voltages. For example, when the input stage 111 receives an input voltage Vin1, the output stage 112 outputs a corresponding output voltage. Then, when the input stage 111 receives an input voltage Vin2, the output stage 112 outputs a corresponding output voltage. Then, when the input stage 111 receives an input voltage Vin3, the output stage 112 outputs another output voltage. However, if the time intervals of the input voltages Vin1 through Vin3 when inputting to the input stage 111 are relatively short, and a slew rate of the operation amplifier OPAn is not high enough, the output voltages outputted from the output stage 112 are unlikely to be accurate as expected.

As well understood, the slew rate of an OP amplifier OPAn is determined by a ratio between a bias current I at the input stage 111 and a compensation capacitance Cc, that is I/Cc. As such, when the compensation capacitance Cc is fixed, increasing the bias current I at the input stage 111 is the only way to improve the slew rate. However, simply increasing the bias current I unfortunately increases the power consumption of the OP amplifier OPAn.

SUMMARY OF THE INVENTION

Accordingly, the present invention is directed to an OP amplifier capable of improving slew rate, so as to reduce the possibility of the problem of power consumption.

The present invention provides an OP amplifier, which may improve a slew rate. The OP amplifier includes an input stage and an output stage. The input stage is adapted to receive one of a plurality of input voltages, and generates an internal voltage according to the received input voltage. The output stage is adapted to receive and gain the internal voltage, and therefore output an output voltage. The output stage includes a first transistor, a plurality of first capacitors and a first switching unit. The first transistor includes a first source/drain terminal coupled to a first voltage, a gate terminal controlled by the internal voltage. The output stage outputs the output voltage according to a voltage at a second source/drain terminal of the first transistor. First terminals of the first capacitors are coupled to the second source/drain terminal of the first transistor. The first switching unit is adapted for selectively transmitting the internal voltage to the second terminal of a corresponding one of the first capacitors.

The present invention employs a plurality of capacitors at the output stage, and pre-charges the capacitors to predetermined voltage levels before the OP amplifier receiving the input voltage. In such a way, when the OP amplifier starts to operate, the switching unit of the output stage can transmit the internal voltage obtained by converting the input terminal to a corresponding capacitor, so as to directly provide a desired output voltage. As such, the present invention can effectively improve the slew rate of the OP amplifier.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1B:
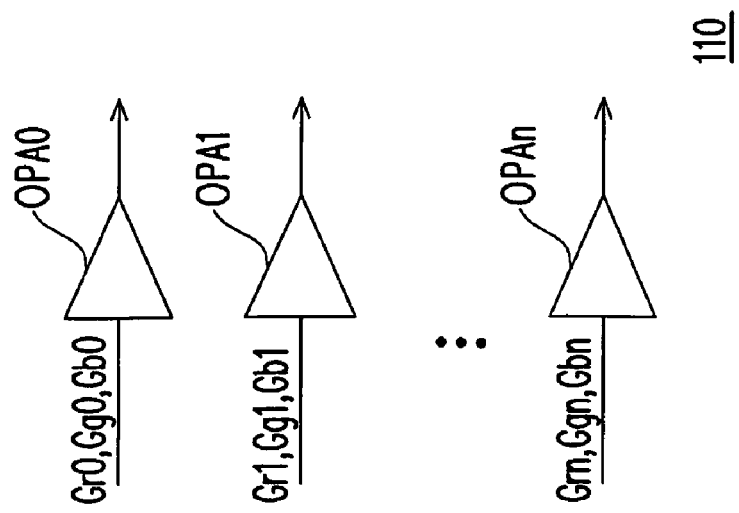
FIG. 1B illustrates the Gamma generator110 in the source driver of FIG. 1A.
Figure 1A:
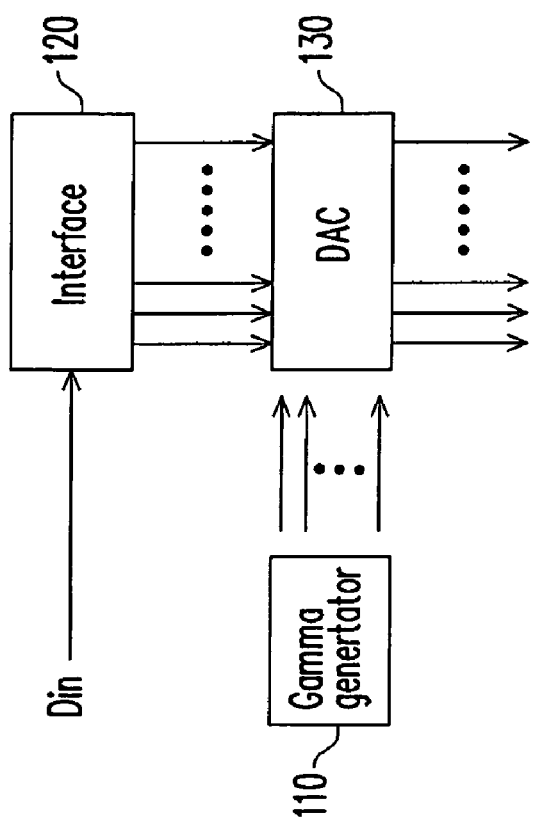
FIG. 1A illustrates a conventional source driver.

Reference will now be made in detail to the present preferred embodiments of the invention, examples of which are illustrated in the accompanying drawings. Wherever possible, the same reference numbers are used in the drawings and the description to refer to the same or like parts.

Figures 1C, 2:
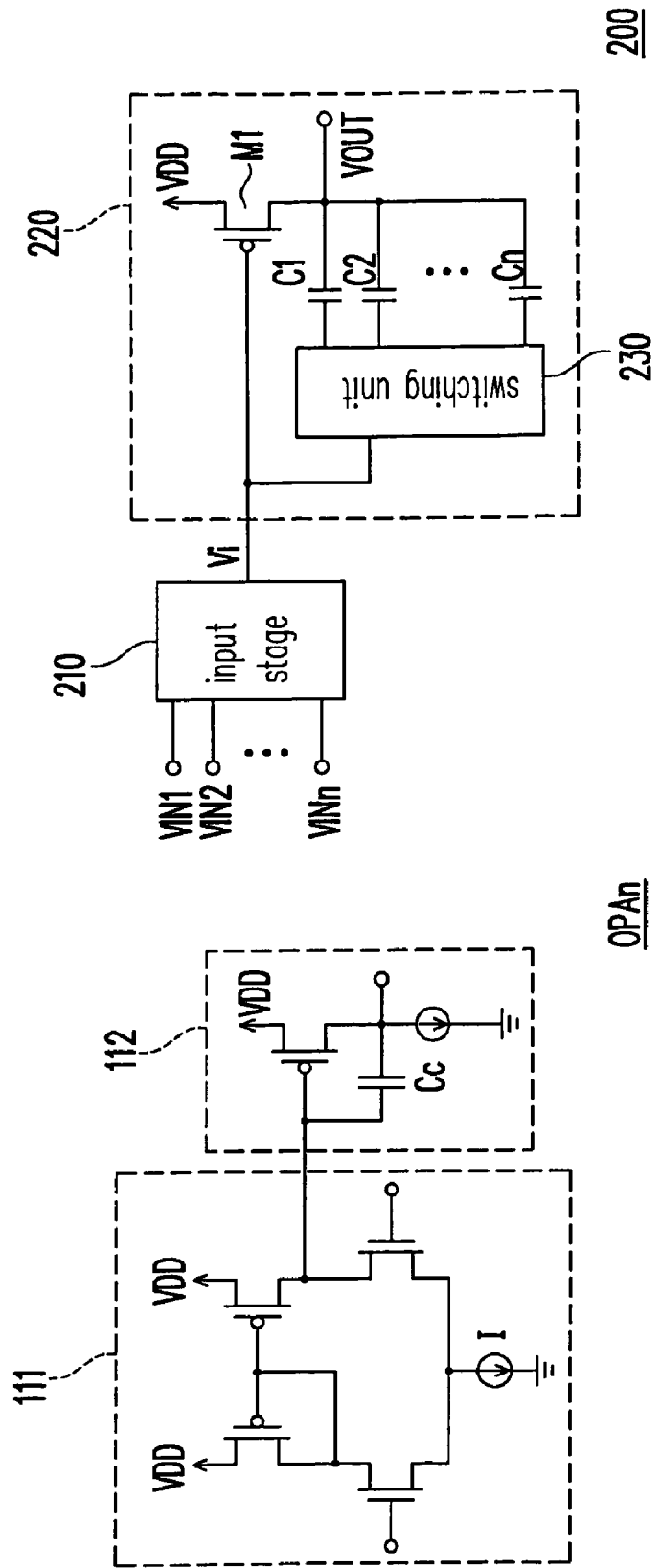
FIG. 1C is a circuit diagram of a conventional OP amplifier.
FIG. 2 is a circuit block diagram illustrating an OP amplifier capable of improving a slew rate according to an embodiment of the present invention.

FIG. 2 is a circuit block diagram illustrating an OP amplifier capable of improving a slew rate according to an embodiment of the present invention. Referring to FIG. 2, there is shown an OP amplifier 200 including an input stage 210 and an output stage 220. The input stage 210 receives one of a plurality of input voltages VIN1 through VINn, and generates an internal voltage Vi according to the received input voltage, in which i is a positive integer between 1 and n. For example, when the input voltage VIN1 is received, then the input stage 210 correspondingly generates an internal voltage V1; when the input voltage VIN2 is received, then the input stage 210 correspondingly generates an internal voltage V2. The output stage 220 is adapted for receiving and amplifying the internal voltage Vi, so as to provide an output voltage VOUT.

Further, the output stage 220 includes a transistor M1, a plurality of capacitors C1 though Cn and a switching unit 230. The transistor M1 includes a first source/drain terminal, a second source/drain terminal, and a gate terminal. The first source/drain terminal of the transistor M1 is coupled to a first voltage, for example an operation voltage VDD. The gate terminal of the transistor M1 is controlled by the internal voltage Vi. The output stage 220 provides the output voltage VOUT according to a voltage at the second source/drain terminal of the transistor M1. Each of the capacitors C1 through Cn includes a first terminal coupled to the second source/drain terminal of the transistor M1, and a second terminal. The switching unit 230 is adapted for selectively transmitting the internal voltage Vi to the second terminal of a corresponding one of the capacitors C1 through Cn.

According to an aspect of the embodiment, the transistor M1 for example is a PMOS transistor. Further, the OP amplifier 200 selectively transmits the internal voltage Vi to the second terminal of a corresponding capacitor via the switching unit 230, so as to directly provide the desired output voltage VOUT, and thus effectively improve the slew rate of the OP amplifier 200.

For illustration convenience, in the following embodiments and the aspects thereof, the quantities of the capacitors are supposed to be 3, represented as C1, C2, and C3, and the quantity of the input voltages is also exemplified as 3, which are represented as VIN1, VIN2, and VIN3. The input voltages VIN1 through VIN3 each has different a voltage level, which is not restricted hereby.

Figure 3:
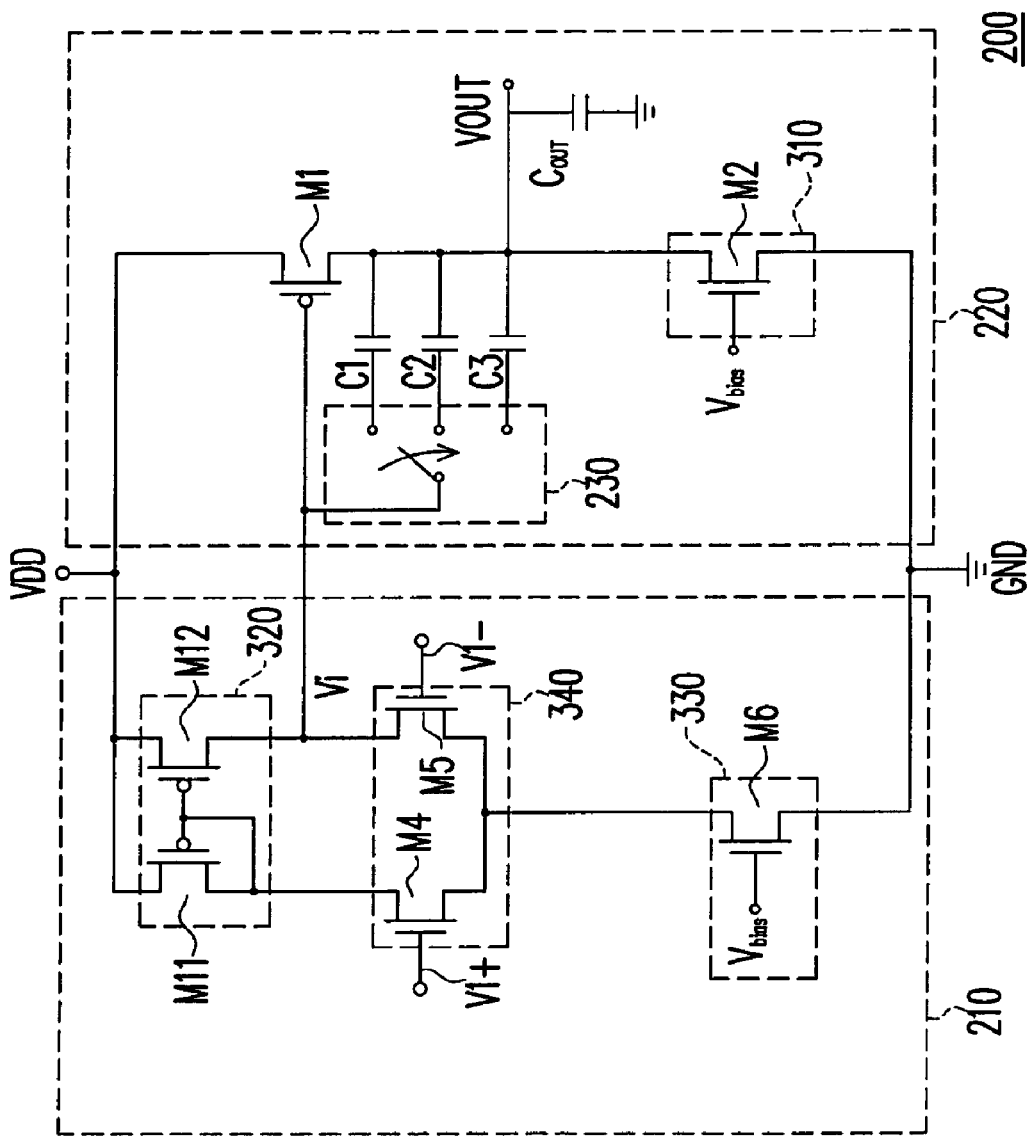
FIG. 3 is a circuit diagram of the OP amplifier according to an embodiment of the present invention.

FIG. 3 is a circuit diagram of the OP amplifier according to an embodiment of the present invention. Referring to FIG. 3, the output stage 220 further includes a current source 310, which includes a transistor M2. The transistor M2 includes a first source/drain terminal, a second source/drain terminal, and a gate. The first source/drain terminal of the transistor M2 is coupled to the second source/drain terminal of the transistor M1. The gate terminal of the transistor M2 is coupled to a bias voltage $V_{bias}$. The second source/drain terminal of the transistor M2 is coupled to a second voltage, for example, a ground voltage GND. According to an aspect of the embodiment, the transistor M2, for example, is an NMOS transistor. The output capacitor $C_{OUT}$ emulates the load of the OP amplifier 200.

The input stage 210 includes a current mirror module 320, a current source 330, a differential input pair 340. The current mirror module 320 includes an input terminal, a first output terminal and a second output terminal. The input terminal of the current mirror module 320 is coupled to the first voltage, i.e., operation voltage VDD. The current mirror module 320 further includes transistors M11, M12, each including a first source/drain terminal, a second source/drain terminal, and a gate terminal. The first source/drain terminal of the transistor M11 is coupled to the first voltage, i.e., operation voltage VDD; and the second source/drain terminal of the transistor M11 is coupled to the gate terminal thereof serving as the first output terminal of the current mirror module 320. The first source/drain terminal of the transistor M12 is coupled to the first voltage, i.e., operation voltage VDD; the gate terminal of the transistor M12 is coupled to the gate terminal of the transistor M11; and the second source/drain terminal of the transistor M12 serves as the second output terminal of the current mirror module 320.

The differential input pair 340 includes transistors M4 and M5. The transistor M4 includes a gate terminal serving as a positive input terminal V1+ of the OP amplifier 200, a first source/drain terminal coupled to the first output terminal of the current mirror module 320, and a second source/drain terminal coupled to the current source 330. The transistor M5 includes a gate terminal serving as negative input terminal V1− of the OP amplifier 200, a first source/drain terminal coupled to the second output terminal of the current mirror module 320, and a second source/drain terminal coupled to the second source/drain terminal of the transistor M4. A voltage at the first source/drain terminal of the transistor M5 is the internal voltage Vi. The current source 330 includes a transistor M6. The transistor M6 includes a first source/drain terminal coupled to the second source/drain terminal of the transistor M4, a gate terminal controlled by the bias voltage $Vb_{ias}$, and a second source/drain terminal coupled to the second voltage, i.e., the ground voltage GND. According to an aspect of the embodiment, the transistors M4 through M6 for example are NMOS transistors, and the transistors M11 and M12 are PMOS transistors.

The circuit structure and coupling relationship of the OP amplifier 200 of FIG. 3 have been illustrated above. Hereinafter, an operation flow of the OP amplifier 200 is illustrated below. First, prior to the operation of the OP amplifier 200, the capacitors C1 through C3 are pre-charged to predetermined voltage levels. After the input voltage VIN1 is inputted to the differential input pair 340, the input voltage VIN1 is converted to be the internal voltage Vi (assume the voltage level is V1), which is then outputted from the second source/drain terminal of the transistor M5. At the same time, the switching unit 230 electrically connects the gate terminal of the transistor M1 and the second terminal of the capacitor C1, so as to use the capacitor C1 as the compensation capacitor. The capacitor C1 has previously charged to a predetermined voltage level (e.g. V1), so that the output voltage VOUT outputted from the output stage 220 can quickly reach a desired level based on the input voltage VIN1.

Then, after receiving the input voltage VIN2, the differential input pair 340 outputs the internal voltage Vi (assume the voltage level is V2) from the first source/drain terminal of the transistor M5. At the same time, the switching unit 230 electrically connects the gate terminal of the transistor M1 and the second terminal of the capacitor C2, so as to use the capacitor C2 as the compensation capacitor. The capacitor C2 has previously charged to a predetermined voltage level (e.g. V2), so that the output voltage VOUT outputted from the output stage 220 can quickly reach a desired level based on the input voltage VIN2.

Then, after receiving the input voltage VIN3, the differential input pair 340 outputs the internal voltage Vi (assume the voltage level is V3) from the second source/drain terminal of the transistor M5. At the same time, the switching unit 230 electrically connects the gate terminal of the transistor M1 and the second terminal of the capacitor C3, so as to use the capacitor C3 as the compensation capacitor. The capacitor C3 has previously charged to a predetermined voltage level (e.g. V3), so that the output voltage VOUT outputted from the output stage 220 can quickly reach a desired level based on the input voltage VIN3.

According to an aspect of the embodiment, because the capacitors C1-C3 respectively correspond to input voltages VIN1, VIN2 and VIN3, the corresponding output voltage VOUT can quickly reach the corresponding desired level. In such a way, the slew rate of the OP amplifier 200 is improved.

Figure 4:
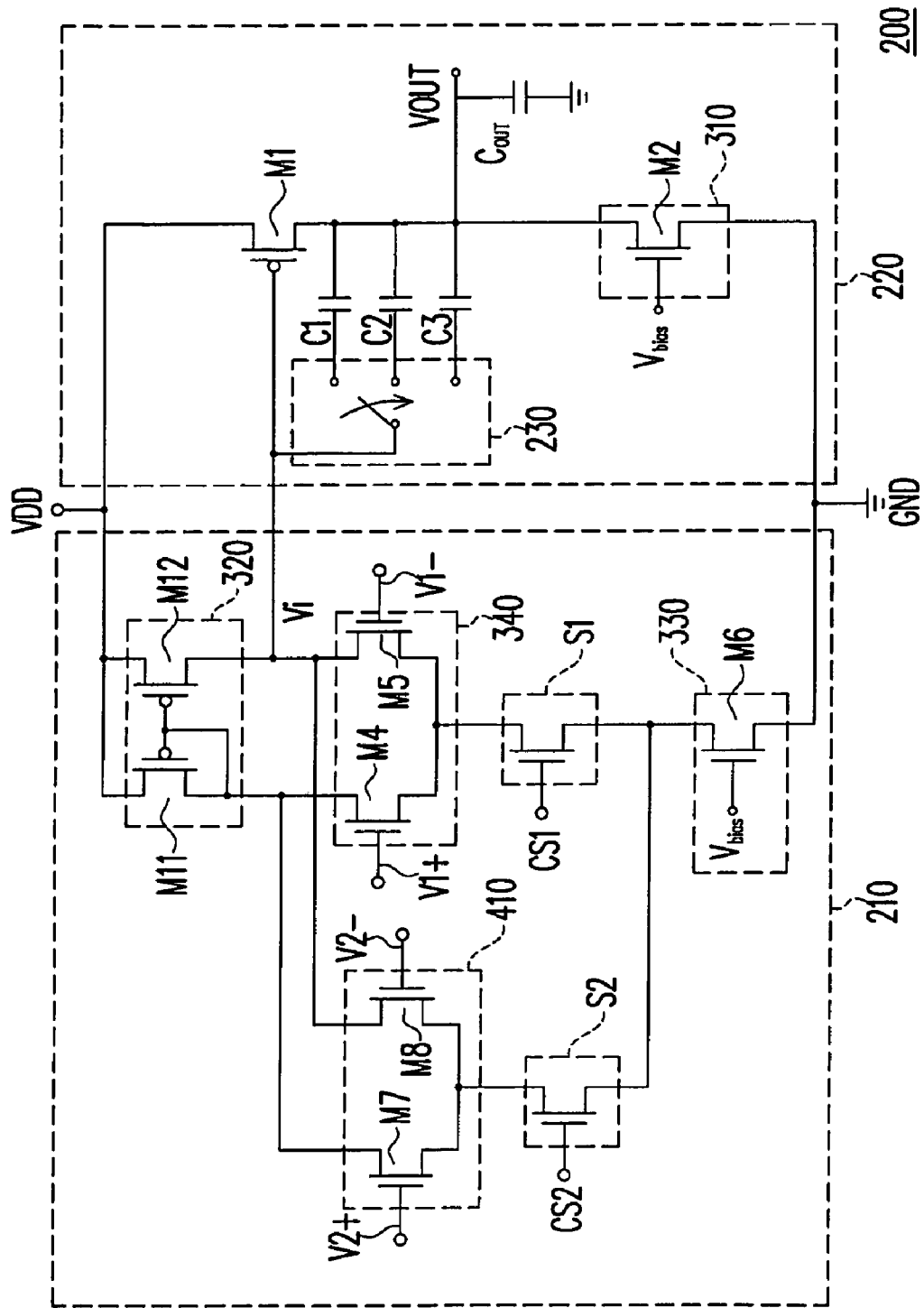
FIG. 4 is a circuit diagram of the OP amplifier according to another embodiment of the present invention.

FIG. 4 is a circuit diagram of the OP amplifier according to another embodiment of the present invention. Referring to FIG. 4, the embodiment as shown in FIG. 4 differs from that of FIG. 3 in that the input stage 210 of FIG. 4 further includes an input differential pair 410 and switching units S1, S2. The switching unit S1 is coupled between the second source/drain terminal of the transistor M4 and the current source 330. The switching unit S1 is controlled by a control signal CS1 to determine whether to couple the second source/drain terminal of the transistor M4 to the current source 330. In other words, when the control signal CS1 is at a logic high voltage level, the second source/drain terminal of the transistor M4 is coupled to the current source 330, and when the control signal CS1 is at a logic low voltage level, the second source/drain terminal of the transistor M4 is disconnected from the current source 330.

The differential input pair 410 includes transistors M7, M8. The transistor M7 includes a gate terminal serving as a second positive input terminal V2+, a first source/drain terminal coupled to the first output terminal of the current mirror module 320, and a second source/drain terminal. The transistor M8 includes a gate terminal serving as a second negative input terminal V2−, a first source/drain terminal coupled to the second output terminal of the current mirror module 320, and a second source/drain terminal coupled to the second source/drain terminal of the transistor M7. The switching unit S2 is coupled between the second source/drain terminal and the current source 330. The switching unit S2 is controlled by a control signal CS2 to determine whether couple the second source/drain terminal to the current source 330. In other words, when the control signal CS2 is at a logic high voltage level, the second source/drain terminal of the transistor M7 is coupled to the current source 330, and when the control signal CS2 is at a logic low voltage level, the second source/drain terminal of the transistor M7 is disconnected from the current source 330.

According to an aspect of the embodiment, the transistors M7, M8, and the switching units S1 and S2, for example, are NMOS transistors. Further, because the input stage 210 includes the differential input pairs 340, 410, the input stage 210 can alternately receive input voltages VIN1 VIN2 and VIN3. That is, while the differential input pair 340 receives the input voltage VIN1, the differential input pair 410 receives the input voltage VIN2. Next, while the differential input pair 340 receives the input voltage VIN3, the differential input pair 410 receives the input voltage VIN1. Next, while the differential input pair 340 receives the input voltage VIN2, the differential input pair 410 receives the input voltage VIN3. The rest may be deduced by analogy.

Further, prior to the operation of the OP amplifier 200, the capacitors C1 through C3 are pre-charged to the predetermined voltage levels. When receiving the input voltages, the differential input pairs simultaneously enable corresponding control signals, so as to allow the input stage 210 to operate. In other words, when receiving the input voltage, the differential input pair 340 enables the control signal CS1, and when the differential input pair 410 enables the control signal CS2. When the differential input pairs receive the input voltage, the switching unit 230 electrically connects the gate terminal of the transistor M1 to the second terminal of the corresponding capacitor, so as to allow the internal voltage Vi generated at the input stage 210 to be transmitted to the second terminal of the corresponding capacitor. Because the capacitor has been previously charged to the predetermined voltage level, the output voltage outputted from the output stage 220 is the voltage of the capacitor.

Figure 5:
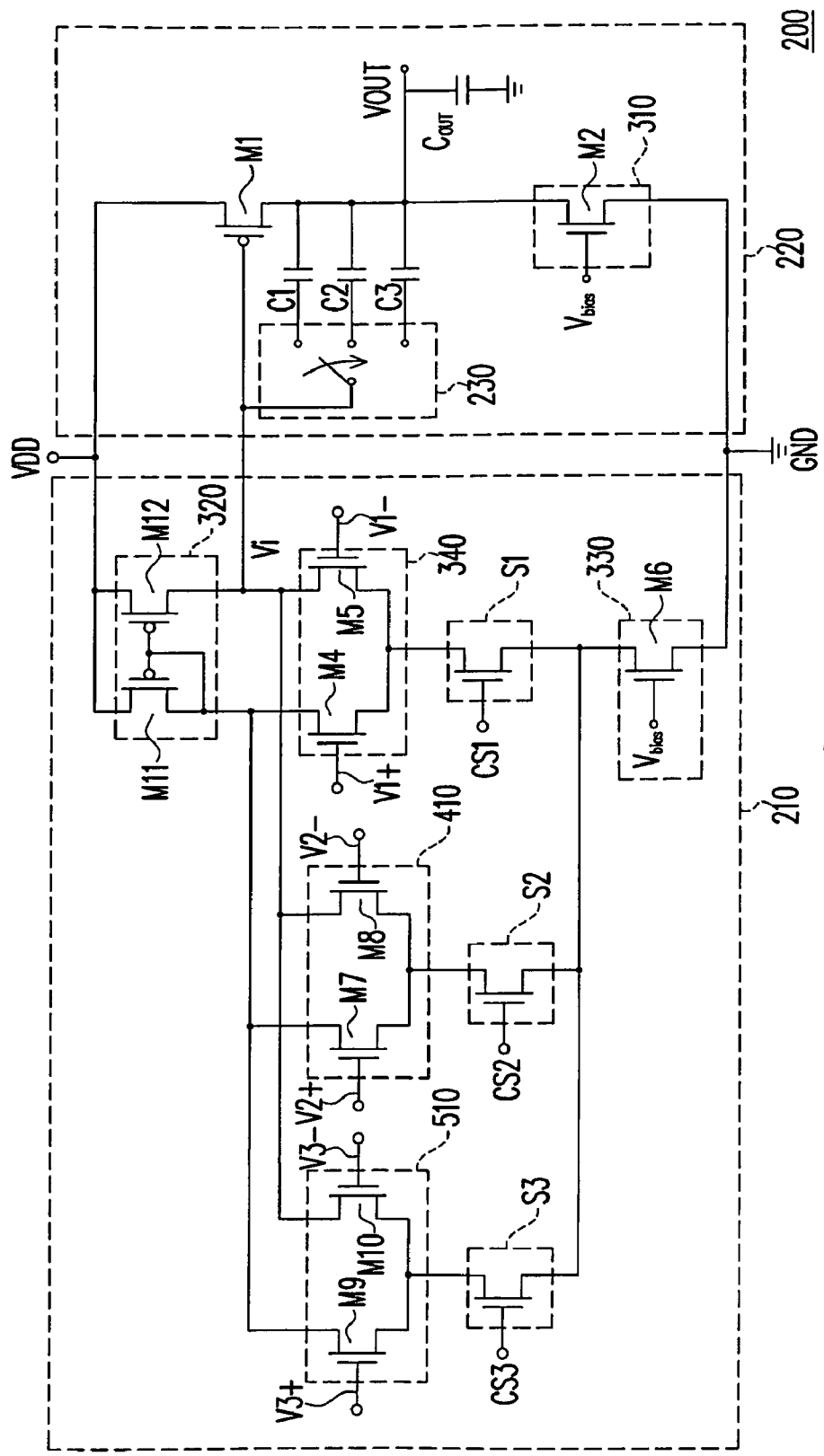
FIG. 5 is a circuit diagram of the OP amplifier according to still another embodiment of the present invention.

FIG. 5 is a circuit diagram of the OP amplifier according to still another embodiment of the present invention. Referring to FIG. 5, the embodiment as shown in FIG. 5 differs from that of FIG. 4 in that the input stage 210 of FIG. 5 further includes an input differential pair 510 and a switching unit S3. The differential input pair 510 further includes transistors M9, M10. The transistor M9 includes a gate terminal serving as a third positive input terminal V3+, a first source/drain terminal coupled to the first output terminal of the current mirror module 320, and a second source/drain. The transistor M10 includes a gate terminal serving as third negative input terminal V3−, a first source/drain terminal coupled to the second output terminal of the current mirror module 320, and a second source/drain terminal coupled to the second source/drain terminal of the transistor M9.

The switching unit S3 is coupled between the second source/drain terminal of the transistor M9 and the current source 330. The switching unit S3 is controlled by a control signal CS3 to determine whether to couple the second source/drain terminal of the transistor M9 to the current source 330. In other words, when the control signal CS3 is at a logic high voltage level, the second source/drain terminal of the transistor M9 is coupled to the current source 330, and when the control signal CS3 is at a logic low voltage level, the second source/drain terminal of the transistor M9 is disconnected from the current source 330. According to an aspect of the embodiment, the transistors M9, M10 and the switching unit S3 are, for example, NMOS transistors.

According to an aspect of the embodiment, the input stage 210 includes differential input pairs 340, 410, and 510, which are adapted to receive the input voltages VIN1 through VIN3, respectively and correspondingly, in which the differential input pair 340 receives the input voltage VIN1, the differential input pair 410 receives the input voltage VIN2, and the differential input pair 510 receives the input voltage VIN3. Hereinafter, the operation of the OP amplifier 200 according to an embodiment of the present invention will be illustrated.

Similarly, prior to the operation of the OP amplifier 200, the capacitors C1 through C3 are pre-charged to predetermined voltage levels, respectively. When the gate terminals of the transistors M4 and M5 of the differential input pair 340, i.e., the positive input terminal V1+ and the negative input terminal V1− of the OP amplifier 200, receive the input voltage VIN1, and at the same time enable the control signal CS1, i.e., the control signal CS1 is at a logic high voltage level, the second source/drain terminals of the transistors M4 and M5 are coupled to the current source 330. Then, the differential input pair 340 converts the input voltage VIN1 to the internal voltage V1, and output the internal voltage V1 from the second source/drain terminal of the transistor M5. On the other hand, when enabling the control signal CS1, the switching unit 230 connects the gate terminal of the transistor M1 with the second terminal of the capacitor C1, so as to allow the internal voltage V1 to be transmitted the second terminal of the capacitor C1. Because the capacitor C1 has been previously charged to a predetermined voltage level, the output voltage VOUT outputted from the output stage 220 is the voltage at the capacitor C1.

Then, the control signal CS1 is disabled, i.e., the control signal CS1 changes a logic low voltage level, so that the differential input pair 340 is disconnected from the current source 330. Therefore, when the gate terminals of the transistors M7 and M8 of the differential input pair 410, i.e., the second positive input terminal V2+ and the second negative input terminal V2− of the OP amplifier 200, receive the input voltage VIN2, and at the same time enable the control signal CS2, the second source/drain terminals of the transistors M7 and M8 are coupled to the current source 330. Then, the differential input pair 410 converts the input voltage VIN2 to the internal voltage V2, and outputs the internal voltage V2 from the first source/drain terminal of the transistor M8. On the other hand, when enabling the control signal CS2, the switching unit 230 connects the gate terminal of the transistor M1 with the second terminal of the capacitor C2, so as to allow the internal voltage V2 to be transmitted to the second terminal of the capacitor C2. Because the capacitor C2 has been previously charged to the predetermined voltage level, the output voltage VOUT outputted from the output stage 220 is the voltage at the capacitor C2.

Then, the control signal CS2 is disabled, i.e., the control signal CS2 changes a logic low voltage level, so that the differential input pair 410 is disconnected from the current source 330. Therefore, when the gate terminals of the transistors M9 and M10 of the differential input pair 510, i.e., the third positive input terminal V3+ and the third negative input terminal V3− of the OP amplifier 200, receive the input voltage VIN3, and at the same time enable the control signal CS3, the second source/drain terminals of the transistors M9 and M10 are coupled to the current source 330. Then, the differential input pair 510 converts the input voltage VIN3 to the internal voltage V3, and outputs the internal voltage V3 from the first source/drain terminal of the transistor M10. On the other hand, when enabling the control signal CS3, the switching unit 230 connects the gate terminal of the transistor M1 with the second terminal of the capacitor C3, so as to allow the internal voltage V3 to be transmitted to the second terminal of the capacitor C3. Because the capacitor C3 has been previously charged to the predetermined voltage level, the output voltage VOUT outputted from the output stage 220 is the voltage at the capacitor C3. In such a way, the OP amplifier 200 according to the embodiment of the present invention achieves a relatively high slew rate.

Figure 6:
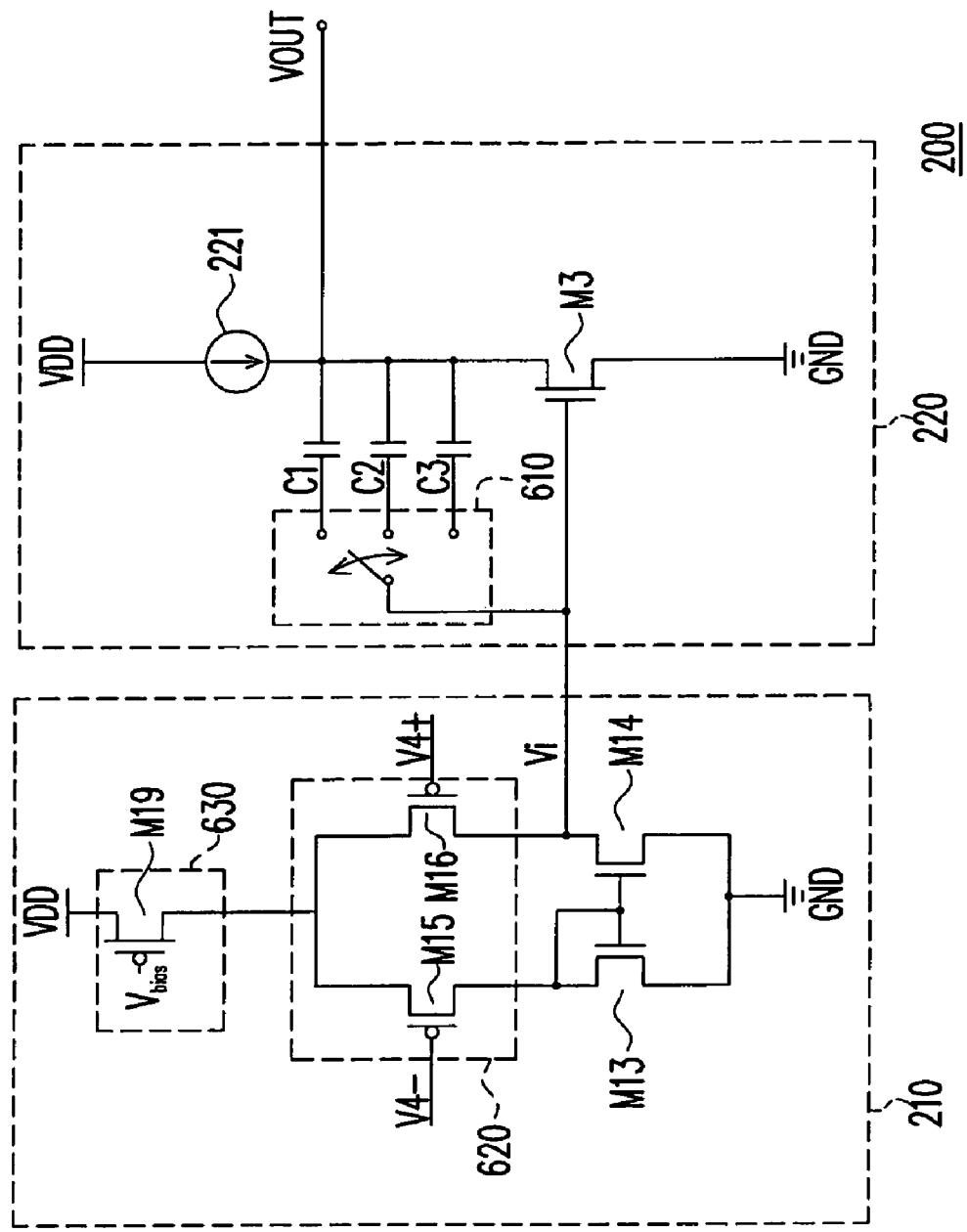
FIG. 6 is a circuit diagram of the OP amplifier according to a further embodiment of the present invention.

FIG. 6 is a circuit diagram of the OP amplifier according to another embodiment of the present invention. The input stage 210 includes a current mirror (transistor M13 and M14), a current source 630, and a differential input pair 620. The first source/drain terminal of the transistor M13 and M14 are coupled to the ground voltage GND. The second source/drain terminal of the transistor M13 is coupled to the gate terminal thereof. The gate terminal of the transistor M14 is coupled to the gate terminal of the transistor M13.

The differential input pair 340 includes transistors M15 and M16. The transistor M15 includes a gate terminal serving as a negative input terminal V4− of the OP amplifier 200, a first source/drain terminal coupled to the second source/drain terminal of the transistor M13, and a second source/drain terminal coupled to the current source 630. The transistor M16 includes a gate terminal serving as a positive input terminal V4+ of the OP amplifier 200, a first source/drain terminal coupled to the second source/drain terminal of the transistor M14, and a second source/drain terminal coupled to the second source/drain terminal of the transistor M15. A voltage at the first source/drain terminal of the transistor M16 is the internal voltage Vi. The current source 330 includes a transistor M19. The transistor M19 includes a first source/drain terminal coupled to the second source/drain terminal of the transistor M15, a gate terminal controlled by the bias voltage $V_{bias}$, and a second source/drain terminal coupled to the operation voltage VDD. According to an aspect of the embodiment, the transistors M13-M14 for example are NMOS transistors, and the transistors M15, M16 and M19 are PMOS transistors.

Referring to FIG. 6, the output stage 220 includes a current source 221, a transistor M3, capacitors C1, C2, and C3, and a switching unit 610. The current source 221 is coupled between the first source/drain terminal of the transistor M3 and the operation voltage VDD. The gate terminal of the transistor M3 is coupled to the input stage 210 for receiving the internal voltage Vi. The second source/drain terminal of the transistor M3 is coupled to a third voltage, e.g., a ground voltage GND. The first terminals of the capacitors C1-C3 are coupled to the first source/drain terminal of the transistor M3. The switching unit 610 selectively transmits the internal voltages Vi to the corresponding second terminals of the capacitors C1-C3. According to an aspect of the embodiment, the transistor M3 is for example an NMOS transistor. Although, it can be seen that the circuit structures of the input stage 210 and the output stage 220 as shown in FIG. 6 are not identical with that shown in FIG. 3, the principles of operation thereof are substantially equivalent. As such, the operation process of FIG. 6 can be deducted from the description of FIG. 3, and is not to be iterated hereby. Likewise, the OP amplifier 200 shown in FIG. 6 is also adapted to effectively improve the slew rate thereof.

Figure 7:
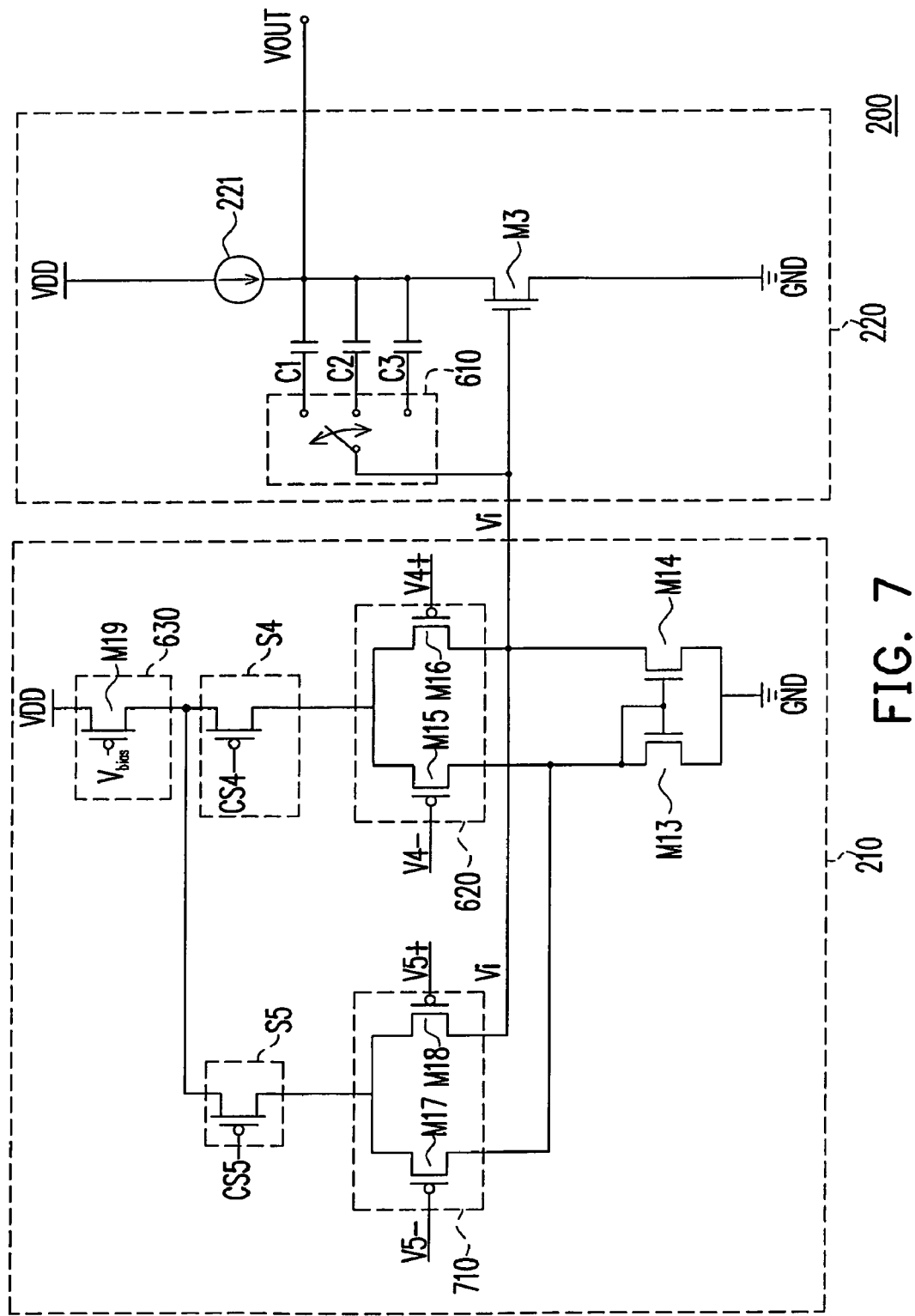
FIG. 7 is a circuit diagram of the OP amplifier according to still a further embodiment of the present invention.

FIG. 7 is a circuit diagram of the OP amplifier according to still a further embodiment of the present invention. The embodiment differs from that of FIG. 6 in that the input stage 210 of FIG. 7 further includes a differential input pair 710 and switching units S4 and S5. The switching unit S4 is coupled between the second source/drain terminal of the transistor M15 and the current source 630. The switching unit S4 is controlled by a control signal CS4 to determine whether to couple the second source/drain terminal of the transistor M15 to the current source 630. In other words, when the control signal CS4 is at a logic low voltage level, the second source/drain terminal of the transistor M15 is coupled to the current source 630, and when the control signal CS4 is at a logic high voltage level, the second source/drain terminal of the transistor M15 is disconnected from the current source 630.

The differential input pair 710 includes transistors M17 and M18. The transistor M17 includes a gate terminal serving as a second negative input terminal V5−, a first source/drain terminal coupled to the second source/drain terminal of the transistor M13, and a second source/drain terminal. The transistor M18 includes a gate terminal serving as a second positive input terminal V5+, a first source/drain terminal coupled to the second source/drain terminal of the transistor M14, and a second source/drain terminal coupled to the second source/drain terminal of the transistor M17.

The switching unit S5 is coupled between the second source/drain terminal and the current source 630. The switching unit S5 is controlled by a control signal CS5, to determine whether to couple the second source/drain terminal of the transistor M17 to the current source 630. In other words, when the control signal CS5 is at a logic low voltage level, the second source/drain terminal of the transistor M17 is coupled to the current source 630, and when the control signal CS5 is at a logic high voltage level, the second source/drain terminal of the transistor M17 is disconnected from the current source 630. According to an aspect of the embodiment, the transistors M15 through M19 and the switching units S4 and S5 are, for example, NMOS transistors. The transistors M13 and M14 are, for example, NMOS transistors.

Although, it can be seen that the circuit structures of the input stage 210 and the output stage 220 as shown in FIG. 7 are not identical with that shown in FIG. 4, the operating principles thereof are substantially equivalent. As such, the operation process of FIG. 7 can be deduced from the description of FIG. 4, and is not to be iterated hereby. Likewise, the OP amplifier 200 shown in FIG. 7 is also adapted to effectively improve the slew rate thereof.

In summary, the embodiment of the present invention employs a plurality of capacitors at the output stage, and pre-charges the capacitors to predetermined voltage levels before the OP amplifier receiving the input voltage. In such a way, when the OP amplifier starts to operate, the switching unit of the output stage can transmit the internal voltage obtained by converting the input terminal to a corresponding capacitor, so as to directly provide a desired output voltage. As such, the present invention eliminates the problem of inaccurate output voltages, associated with the conventional OP amplifier, caused by short charging-discharging times to capacitors due to the inputting of input voltages of different voltage levels having relatively short intervals therebetween. In such a way, the embodiments according to the present invention is then capable of improving a slew rate of the OP amplifier, without increasing the current of the current source in addition. As such power consumption of the circuit can also be saved.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An operation amplifier (OP amplifier), comprising:
an input switching unit for receiving a plurality of input voltages and selectively outputting one of the input voltages;
an input stage, for receiving the input voltage from the input switching unit, and generating an internal voltage according to the input voltage; and
an output stage, for receiving and gaining the internal voltage, so as to output an output voltage, wherein the output stage comprises:
a first transistor, having a first source/drain terminal coupled to a first voltage, a second source/drain terminal, and a gate terminal controlled by the internal voltage, wherein the output stage outputs the output voltage according to a voltage at a second source/drain terminal of the first transistor;
a plurality of first capacitors; and
a first switching unit, adapted for selectively connecting one of the first capacitors between the gate terminal and the second source/drain terminal of the first transistor.

2. The OP amplifier according to claim 1, wherein the output stage comprises a first current source coupled to the second source/drain terminal of the first transistor.

3. The OP amplifier according to claim 2, wherein the first current source comprises a second transistor having a first source/drain terminal coupled to the second source/drain terminal of the first transistor, a gate terminal coupled to a bias voltage, and a second source drain terminal coupled to a second voltage.

4. The OP amplifier according to claim 1, wherein the output stage comprises an output capacitor having a first terminal coupled to the second source/drain terminal of the first transistor, and a second terminal coupled to a second voltage.

5. The OP amplifier according to claim 1, wherein the input stage further comprises:
a current mirror module, comprising an input terminal, a first output terminal, and a second output terminal, wherein the input terminal of the current mirror module is coupled to the first voltage;
a second current source; and
a differential input pair, comprising:
a fourth transistor, having a gate terminal serving as a first positive input terminal of the OP amplifier, a first source/drain terminal coupled to the first output terminal of the current mirror module, and a second source/drain terminal coupled to the second current source; and
a fifth transistor, having a gate terminal serving as a first negative input terminal of the OP amplifier, a first source/drain terminal coupled to the second output terminal of the current mirror module, and a a second source/drain terminal coupled to the second source/drain terminal of the fourth transistor,
wherein a voltage at the first source/drain terminal of the fifth transistor is the internal voltage.

6. The OP amplifier according to claim 5, wherein the second current source comprises a sixth transistor having a first source/drain terminal coupled to the second source/drain terminal of the fourth transistor, a gate terminal control by a bias voltage, and a second source/drain terminal coupled to a second voltage.

7. The OP amplifier according to claim 5, wherein the input stage comprises:
a first switching unit, coupled between the second source/drain terminal of the fourth transistor and the second current source, for determining whether to couple the second source/drain terminal of the fourth transistor to the second current source according to a first control signal;
a second differential input pair, comprising:
a seventh transistor, having a gate terminal serving a second positive input terminal of the OP amplifier, a first source/drain terminal coupled to the first output terminal of the current mirror module, and a second source/drain terminal; and
an eighth transistor, having a gate terminal serving as a second negative input terminal of the OP amplifier, a first source/drain terminal coupled to the second output terminal of the current mirror module, and a second source/drain terminal coupled to the second source/drain terminal of the seventh transistor; and
a second switching unit, coupled between the second source/drain terminal of the seventh transistor and the second current source, for determining whether to couple the second source/drain terminal of the seventh transistor to the second current source according to a second control signal.

8. The OP amplifier according to claim 7, wherein the input stage comprises:
a third differential input pair, comprising:
a ninth transistor, having a gate terminal serving as a third positive input terminal of the OP amplifier, a first source/drain terminal coupled to the first output terminal of the current mirror module, and a second source/drain terminal; and a tenth transistor, having a gate terminal serving as a third negative input terminal of the OP amplifier, a first source/drain terminal coupled to the second output terminal of the current mirror module, and a second source/drain terminal coupled to the second source/drain terminal of the ninth transistor; and a third switching unit, coupled between the second source/drain terminal of the ninth transistor and the second current source, for determining whether to couple the second source/drain terminal of the ninth transistor to the second current source according to a third control signal.

9. The OP amplifier according to claim 5, wherein the current mirror module comprises:

an eleventh transistor, having a first source/drain terminal coupled to the first voltage, a second source/drain terminal and a gate terminal, wherein the second source/drain terminal and the gate terminal of the eleventh transistor are coupled to each other to serve as the first output terminal of the current mirror module; and a twelfth transistor, having a first source/drain terminal coupled to the first voltage, a gate terminal coupled to the gate terminal of the eleventh transistor, and a second source/drain terminal serving as the second output terminal of the current mirror module.

10. The OP amplifier according to claim 1, wherein the input stage further comprises:

a thirteenth transistor, having a first source/drain terminal coupled to the third voltage, a second source/drain terminal and a gale terminal;

a fourteenth transistor, having a first source/drain terminal coupled to the third voltage, a second source/drain terminal, and a gate terminal coupled to the gate terminal of the thirteenth transistor;

a differential input pair, comprising:

a fifteenth transistor, having a gate terminal serving as a first positive input terminal of the OP amplifier, a first source/drain terminal coupled to the second source/drain terminal of the thirteenth transistor, and a second source/drain terminal; and a sixteenth transistor, having a gate terminal serving as a first negative input terminal of the OP amplifier, a first source/drain terminal coupled to the second source/drain terminal of the fourteenth transistor, a second source/drain terminal coupled to the second source/drain terminal of the fifteenth transistor, wherein a voltage at the first source/drain terminal of the sixteenth transistor is the internal voltage; and a third current source, coupled to the second source/drain terminal of the fifteenth transistor.

11. The OP amplifier according to claim 10, wherein the input stage further comprises:

a fourth switching unit, coupled between the second source/drain terminal of the fifteenth transistor and the third current source, and controlled by a fourth control signal to determine whether to couple the second source/drain terminal of the fifteenth transistor to the third current source;

a fifth differential input pair, comprising:

a seventeenth transistor, having a gate terminal serving as a second positive input terminal of the OP amplifier, a first source/drain terminal coupled to the second source/drain terminal of the thirteenth transistor; and an eighteenth transistor, having a gate terminal serving as a second negative input terminal of the OP amplifier, a first source/drain terminal coupled to the second source/drain terminal of the fourteenth transistor, and a second source/drain terminal coupled to the second source/drain terminal of the seventeenth transistor; and a fifth switching unit, coupled between the second source/drain terminal of the seventeenth transistor and the third current source, for determining whether to couple the second source/drain terminal of the seventeenth transistor to the third current source according to a fifth control signal.

12. The OP amplifier according to claim 10, wherein the third current source comprises a nineteenth transistor having a first source/drain terminal coupled to the second source/drain terminal of the fifteenth transistor, a gate terminal coupled to a bias voltage, and a second source/drain terminal coupled to the first voltage.

* * * * *